(12) United States Patent
Kubota

(10) Patent No.: US 11,791,135 B2
(45) Date of Patent: Oct. 17, 2023

(54) PLASMA PROCESSING APPARATUS AND PLASMA PROCESSING METHOD

(71) Applicant: Tokyo Electron Limited, Tokyo (JP)

(72) Inventor: Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 178 days.

(21) Appl. No.: 17/505,623

(22) Filed: Oct. 20, 2021

(65) Prior Publication Data

US 2022/0122810 A1 Apr. 21, 2022

(30) Foreign Application Priority Data

Oct. 21, 2020 (JP) .................................. 2020-176685

(51) Int. Cl.
*H01J 37/32* (2006.01)
(52) U.S. Cl.
CPC .. *H01J 37/32183* (2013.01); *H01J 37/32146* (2013.01); *H01J 37/32935* (2013.01)
(58) Field of Classification Search
CPC ........... H01J 37/32935; H01J 37/32155; H01J 37/32091; H01J 37/32146; H01J 37/32165; H01J 37/32183; H01J 37/32706; H05H 2007/008; H05H 2007/02

See application file for complete search history.

(56) References Cited

U.S. PATENT DOCUMENTS

2004/0116080 A1 6/2004 Chen et al.
2009/0294061 A1* 12/2009 Shannon ........... H01J 37/32183
118/723 MP

* cited by examiner

*Primary Examiner* — Henry Luong
(74) *Attorney, Agent, or Firm* — XSENSUS LLP

(57) ABSTRACT

A plasma processing apparatus includes a chamber, substrate support, radio-frequency (RF) power supply, bias power supply, measuring device, and controller. The RF power supply provides RF power to a lower electrode included in the substrate support in the chamber or to an upper electrode. The bias power supply provides RF bias power to the lower electrode. The measuring device measures a frequency of a reflected wave of the RF power returned toward the RF power supply. The controller controls the bias power supply to adjust a power level of the RF bias power to a peak value of absolute values of negative shifts in frequency of the reflected wave from a frequency of the RF power, or controls the RF power supply to modulate the RF power in a cycle obtained based on an occurrence time of the peak of absolute values.

20 Claims, 10 Drawing Sheets

PLASMA PROCESSING APPARATUS AND PLASMA PROCESSING METHOD

CROSS-REFERENCE TO RELATED APPLICATION

This application claims priority to Japanese Patent Application No. 2020-176685 filed on Oct. 21, 2020, the entire disclosure of which is incorporated herein by reference.

BACKGROUND

Technical Field

Exemplary embodiments of the present disclosure relate to a plasma processing apparatus and a plasma processing method.

Description of the Background

Plasma processing is performed on substrates using a plasma processing apparatus. The plasma processing apparatus includes a chamber and a substrate support. The substrate support includes a lower electrode and is accommodated in the chamber. A substrate is placed on the substrate support. In the plasma processing apparatus, radio-frequency power is provided to generate plasma in the chamber. Radio-frequency bias power is provided to the lower electrode to draw ions in the plasma toward the substrate. Patent Literature 1 describes an example of a plasma processing apparatus. The plasma processing apparatus described in Patent Literature 1 measures the potential of the lower electrode to estimate the potential of a substrate.

CITATION LIST

Patent Literature

Patent Literature 1: U.S. Patent Application Publication No. 2004/0116080

BRIEF SUMMARY

One or more aspects of the present disclosure are directed to a technique for controlling radio-frequency power or radio-frequency bias power in accordance with the potential of a substrate in a plasma processing apparatus.

A plasma processing apparatus according to an exemplary embodiment includes a chamber, a substrate support, a radio-frequency power supply, a bias power supply, a measuring device, and a controller. The substrate support includes a lower electrode and is accommodated in the chamber. The radio-frequency power supply provides radio-frequency power to the lower electrode or an upper electrode above the lower electrode. The bias power supply provides radio-frequency bias power to the lower electrode. The measuring device measures a frequency of a reflected wave of the radio-frequency power. The reflected wave is returned toward the radio-frequency power supply. The controller controls the bias power supply to adjust a power level of the radio-frequency bias power in accordance with a peak value of absolute values of negative shifts in the frequency of the reflected wave from a frequency of the radio-frequency power, or controls the radio-frequency power supply to modulate the radio-frequency power in a cycle obtained based on an occurrence time of a peak of absolute values of negative shifts in the frequency of the reflected wave from the frequency of the radio-frequency power.

The plasma processing apparatus according to the above exemplary embodiment allows control of radio-frequency power or radio-frequency bias power in accordance with the potential of a substrate.

DETAILED DESCRIPTION

Figure 1:
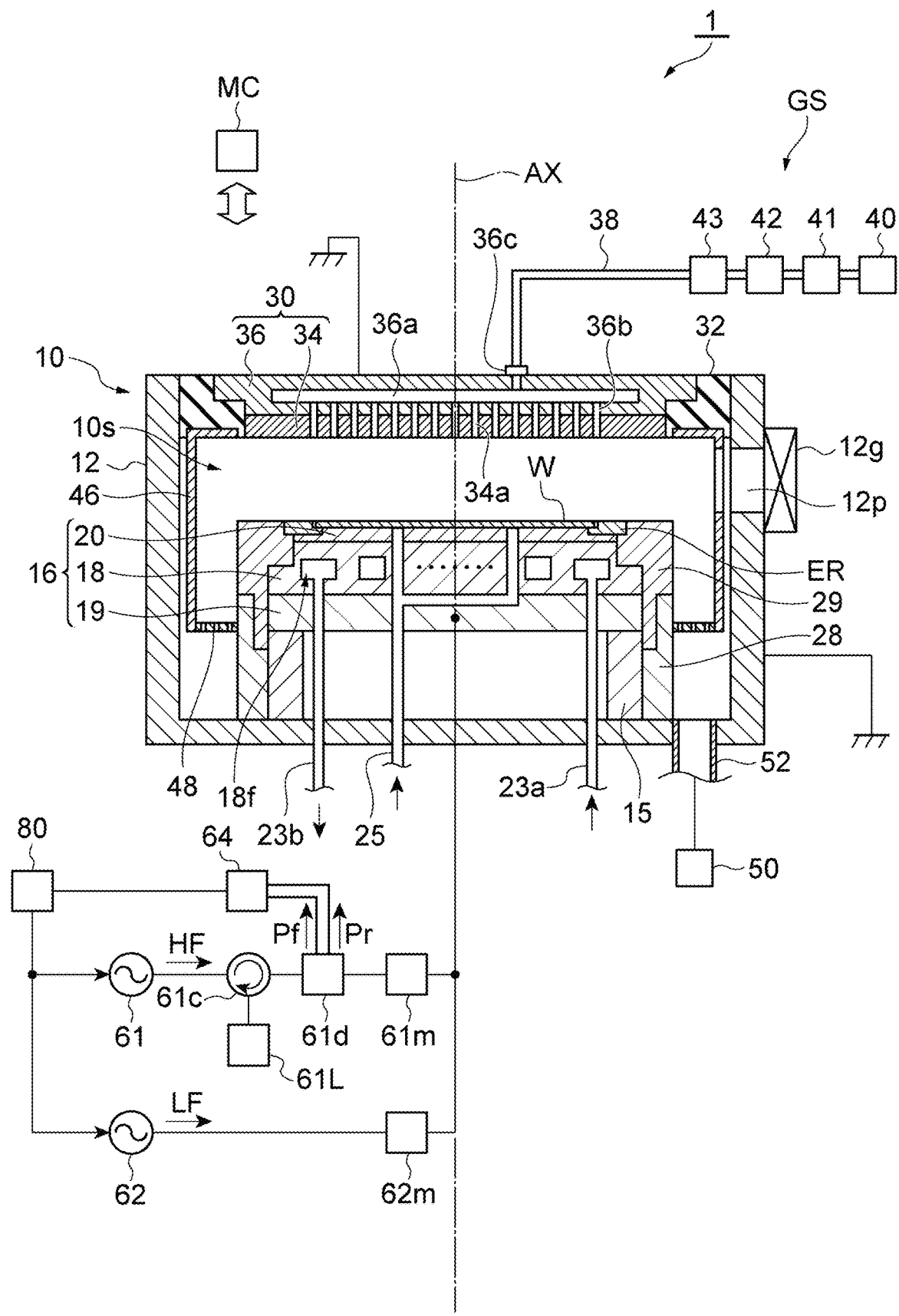
FIG. 1 is a schematic diagram of a plasma processing apparatus according to an exemplary embodiment.

Exemplary embodiments will now be described.

A plasma processing apparatus according to an exemplary embodiment includes a chamber, a substrate support, a radio-frequency power supply, a bias power supply, a measuring device, and a controller. The substrate support includes a lower electrode and is accommodated in the chamber. The radio-frequency power supply provides radio-frequency power to the lower electrode or an upper electrode above the lower electrode. The bias power supply provides radio-frequency bias power to the lower electrode. The measuring device measures a frequency of a reflected wave of the radio-frequency power. The reflected wave is returned toward the radio-frequency power supply. The controller controls the bias power supply to adjust a power level of the radio-frequency bias power in accordance with a peak value of absolute values of negative shifts in the frequency of the reflected wave from a frequency of the radio-frequency power, or controls the radio-frequency power supply to modulate the radio-frequency power in a cycle obtained based on an occurrence time of a peak of absolute values of negative shifts in the frequency of the reflected wave from the frequency of the radio-frequency power.

A substrate has its potential changing periodically in a cycle defined by the frequency of radio-frequency bias power. In response to a potential switching in the substrate from negative to positive, the frequency of the reflected wave has a large negative shift from the frequency of the radio-frequency power. The peak value of the absolute values of the negative shifts, or in other words, the peak value of the absolute values of the negative shifts in the frequency of the reflected wave from the frequency of the radio-frequency power is correlated with the amplitude (Vpp) of the potential of the substrate. In the above embodiment, the radio-frequency bias power is controlled to have a power level adjusted in accordance with the peak value of the absolute values of the negative shifts, which is correlated with the amplitude Vpp. The structure according to the above embodiment thus allows control of the radio-frequency bias power to have a power level in accordance with the amplitude of the substrate potential. The structure according to the above embodiment thus allows control of the energy of ions striking the substrate in accordance with the amplitude of the substrate potential. The cycle of changes in the substrate potential over time can be obtained based on the occurrence time of the peak of the absolute values of the negative shifts in the frequency of the reflected wave. The structure according to the above embodiment allows modulation of the radio-frequency power in the obtained cycle. This allows modulation of the radio-frequency power in accordance with changes in the substrate potential over time.

In one exemplary embodiment, the controller may determine the occurrence time of the peak based on an occurrence time of the peak value or on an occurrence time of a peak of negative shifting in the frequency of the reflected wave from the frequency of the radio-frequency power, and obtain the cycle.

In one exemplary embodiment, the controller may control the radio-frequency power supply to generate the radio-frequency power in pulses in the cycle.

In one exemplary embodiment, the controller may specify, for the radio-frequency power supply, a time and a duration to provide the radio-frequency power in pulses in the cycle. The radio-frequency power supply may start to generate the radio-frequency power in pulses at the time specified by the controller and continue to generate the radio-frequency power in pulses for the duration specified by the controller in the cycle.

In one exemplary embodiment, the controller may control the radio-frequency power supply to modulate the frequency of the radio-frequency power in the cycle.

In one exemplary embodiment, the peak value may be a peak value of a difference between the frequency of the radio-frequency power and the frequency of the reflected wave.

A plasma processing method according to another exemplary embodiment includes providing radio-frequency power for generating plasma and providing radio-frequency bias power. The radio-frequency power is provided from a radio-frequency power supply to a lower electrode included in a substrate support or to an upper electrode above the lower electrode. The substrate support is accommodated in a chamber in a plasma processing apparatus. The radio-frequency bias power is provided to the lower electrode from a bias power supply. The plasma processing method further includes measuring a frequency of a reflected wave of the radio-frequency power. The reflected wave is returned toward the radio-frequency power supply. The plasma processing method further includes adjusting a power level of the radio-frequency bias power in accordance with a peak value of absolute values of negative shifts in the frequency of the reflected wave from a frequency of the radio-frequency power.

A plasma processing method according to still another exemplary embodiment includes providing radio-frequency power for generating plasma and providing radio-frequency bias power. The radio-frequency power is provided from a radio-frequency power supply to a lower electrode included in a substrate support or to an upper electrode above the lower electrode. The substrate support is accommodated in a chamber in a plasma processing apparatus. The radio-frequency bias power is provided to the lower electrode from a bias power supply. The plasma processing method further includes measuring a frequency of a reflected wave of the radio-frequency power. The reflected wave is returned toward the radio-frequency power supply. The plasma processing method further includes modulating the radio-frequency power in a cycle obtained based on an occurrence time of a peak of absolute values of negative shifts in the frequency of the reflected wave from a frequency of the radio-frequency power.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

FIG. 1 is a schematic diagram of a plasma processing apparatus according to an exemplary embodiment. A plasma processing apparatus 1 shown in FIG. 1 is a capacitively coupled plasma processing apparatus.

The plasma processing apparatus 1 includes a chamber 10. The chamber 10 has an internal space 10s. The central axis of the chamber 10 is an axis AX extending in the vertical direction. In one embodiment, the chamber 10 includes a chamber body 12. The chamber body 12 is substantially cylindrical and has the internal space 10s. The chamber body 12 is formed from, for example, aluminum. The chamber body 12 is electrically grounded. The chamber body 12 has an inner wall coated with an anticorrosive film, which may be formed from a ceramic material such as aluminum oxide or yttrium oxide.

The chamber body 12 has a side wall having a port 12p. A substrate W is transferred between the internal space 10s and the outside of the chamber 10 through the port 12p. The port 12p is open and closed by a gate valve 12g. The gate valve 12g is on the side wall of the chamber body 12.

The plasma processing apparatus 1 further includes a substrate support 16. The substrate support 16 supports the substrate W in the chamber 10. The substrate W may be substantially disk-shaped. The substrate support 16 may be supported on a support 15. The support 15 extends upward from the bottom of the chamber body 12. The support 15 is substantially cylindrical and is formed from an insulator such as quartz.

The substrate support 16 may include a lower electrode 18 and an electrostatic chuck (ESC) 20. The substrate support 16 may further include an electrode plate 19. The electrode plate 19 is formed from a conductive material such as aluminum. The electrode plate 19 is substantially disk-shaped and has its central axis being the axis AX. The lower electrode 18 is on the electrode plate 19. The lower electrode 18 is formed from a conductive material such as aluminum. The lower electrode 18 is substantially disk-shaped and has its central axis being the axis AX. The lower electrode 18 is electrically coupled to the electrode plate 19.

The lower electrode 18 has an internal channel 18f for carrying a heat-exchange medium (e.g., a refrigerant) supplied through a pipe 23a from a supply unit (e.g., chiller unit). The supply unit is external to the chamber 10. The heat-exchange medium supplied to the channel 18f flows through the channel 18f and returns to the supply unit through a pipe 23b. The supply unit for the heat-exchange medium serves as a temperature adjuster in the plasma processing apparatus 1.

The ESC 20 is on the lower electrode 18. The substrate W is placed on an upper surface of the ESC 20. The ESC 20 includes a body and an electrode. The body of the ESC 20 is formed from a dielectric. The ESC 20 and its body are substantially disk-shaped and each have the central axis being the axis AX. In the ESC 20, the electrode is a film electrode located in the body. The electrode in the ESC 20 is coupled to a direct-current (DC) power supply via a switch. A voltage is applied from the DC power supply to the electrode in the ESC 20 to generate an electrostatic attraction between the ESC 20 and the substrate W. The electrostatic attraction causes the ESC 20 to attract and hold the substrate W.

The substrate support 16 may further support an edge ring ER placed on it. The edge ring ER may be formed from silicon, silicon carbide, or quartz. The substrate W is placed in an area on the ESC 20 surrounded by the edge ring ER.

The plasma processing apparatus 1 may further include a gas supply line 25. The gas supply line 25 supplies a heat-transfer gas (e.g., He gas) from a gas supply assembly into a space between the upper surface of the ESC 20 and a back surface (lower surface) of the substrate W.

The plasma processing apparatus 1 may further include a cylindrical portion 28 and an insulating portion 29. The cylindrical portion 28 extends upward from the bottom of the chamber body 12. The cylindrical portion 28 extends along the outer periphery of the support 15. The cylindrical portion 28 is substantially cylindrical and is formed from a conductive material. The cylindrical portion 28 is electrically grounded. The insulating portion 29 is located on the cylindrical portion 28. The insulating portion 29 is formed from an insulating material including a ceramic material, such as quartz. The insulating portion 29 is substantially cylindrical. The insulating portion 29 extends along the outer periphery of the electrode plate 19, the outer periphery of the lower electrode 18, and the outer periphery of the ESC 20.

The plasma processing apparatus 1 further includes an upper electrode 30. The upper electrode 30 is located above the substrate support 16. The upper electrode 30 is supported on an upper portion of the chamber body 12 with a member 32 formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10s. The ceiling plate 34 may be formed from a low resistance conductor or a semiconductor with less Joule heat. In one embodiment, the ceiling plate 34 is formed from silicon. The ceiling plate 34 has multiple gas holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a and also has multiple gas holes 36b. The gas holes 36b extend downward from the gas-diffusion compartment 36a. The gas holes 36b communicate with the respective gas holes 34a. The support member 36 further has a gas inlet 36c. The gas inlet 36c connects to the gas-diffusion compartment 36a. The gas inlet 36c also connects to a gas supply pipe 38.

The gas supply pipe 38 is connected to a set of gas sources 40 via a set of valves 41, a set of flow controllers 42, and a set of valves 43. The gas source set 40, the valve set 41, the flow controller set 42, and the valve set 43 form a gas supply unit GS. The gas source set 40 includes multiple gas sources that are used with a method MT. The valve sets 41 and 43 each include multiple open-close valves. The flow controller set 42 includes multiple flow controllers. The flow controllers in the flow controller set 42 are mass flow controllers or pressure-based flow controllers. The gas sources in the gas source set 40 are connected to the gas supply pipe 38 via the respective open-close valves in the valve set 41, via the respective flow controllers in the flow controller set 42, and via the respective open-close valves in the valve set 43.

The plasma processing apparatus 1 may further include a shield 46. The shield 46 is located along the inner wall of the chamber body 12 in a detachable manner. The shield 46 prevents a plasma processing product from accumulating on the chamber body 12. The shield 46 includes, for example, an aluminum member coated with an anticorrosive film. The anticorrosive film may be a film of ceramic such as yttrium oxide.

The plasma processing apparatus 1 may further include a baffle 48. The baffle 48 is located between a member surrounding the substrate support 16 (e.g., the cylindrical portion 28) and the shield 46. The baffle 48 includes, for example, an aluminum member coated with an anticorrosive film. The anticorrosive film may be a film of ceramic such as yttrium oxide. The baffle 48 has multiple through-holes. The chamber body 12 has an outlet in its bottom below the baffle 48. The outlet is connected to an exhaust device 50 through an exhaust pipe 52. The exhaust device 50 includes a pressure control valve and a vacuum pump such as a turbomolecular pump.

The plasma processing apparatus 1 further includes a radio-frequency (RF) power supply 61 and a bias power supply 62. The RF power supply 61 generates RF power (hereinafter referred to as RF power HF). The RF power HF has a frequency suitable for generating plasma. The RF power HF has a frequency ranging from, for example, 27 to 300 MHz inclusive. The RF power supply 61 may include a generator that generates RF signals and an amplifier that amplifies the RF signals from the generator to generate RF power HF. The RF power supply 61 is coupled to the lower electrode 18 via an impedance matching circuit, or a matcher 61m. The matcher 61m includes a circuit for matching the impedance of a load (the lower electrode 18) for the RF power supply 61 and the output impedance of the RF power supply 61. In one embodiment, the RF power supply 61 may serve as a plasma generator. The RF power supply 61 may be coupled to the upper electrode 30 via the matcher 61m.

The bias power supply 62 provides RF bias power LF to the lower electrode 18. The RF bias power LF has a frequency suitable for drawing ions toward the substrate W. The RF bias power LF has a frequency ranging from, for example, 100 kHz to 13.56 MHz inclusive. The bias power supply 62 may include a generator that generates RF signals and an amplifier that amplifies the RF signals from the generator to generate RF bias power LF. The bias power supply 62 is coupled to the lower electrode 18 via an impedance matching circuit, or a matcher 62m. The matcher 62m includes a circuit for matching the impedance of a load (the lower electrode 18) for the bias power supply 62 and the output impedance of the bias power supply 62.

The plasma processing apparatus 1 includes a measuring device 64, which is coupled to a directional coupler 61d. The directional coupler 61d is coupled between the RF power supply 61 and the matcher 61m. A circulator 61c may be coupled between the RF power supply 61 and the measuring device 64. The circulator 61c feeds the RF power HF toward the directional coupler 61d. The circulator 61c feeds a reflected wave of the RF power HF from the directional coupler 61d toward a dummy load 61L.

The directional coupler 61d outputs a forward wave Pf and a reflected wave Pr to the measuring device 64. The forward wave Pf is a part of the RF power HF provided from the RF power supply 61 toward the lower electrode 18. The reflected wave Pr is a part of the RF power HF returned from the load toward the RF power supply 61.

The measuring device 64 measures a frequency fPr of the reflected wave Pr. The measuring device 64 provides the measured frequency fPr to a controller 80. The measuring device 64 may further measure a frequency fPf of the forward wave Pf and may provide the frequency fPf to the controller 80.

Figure 2:
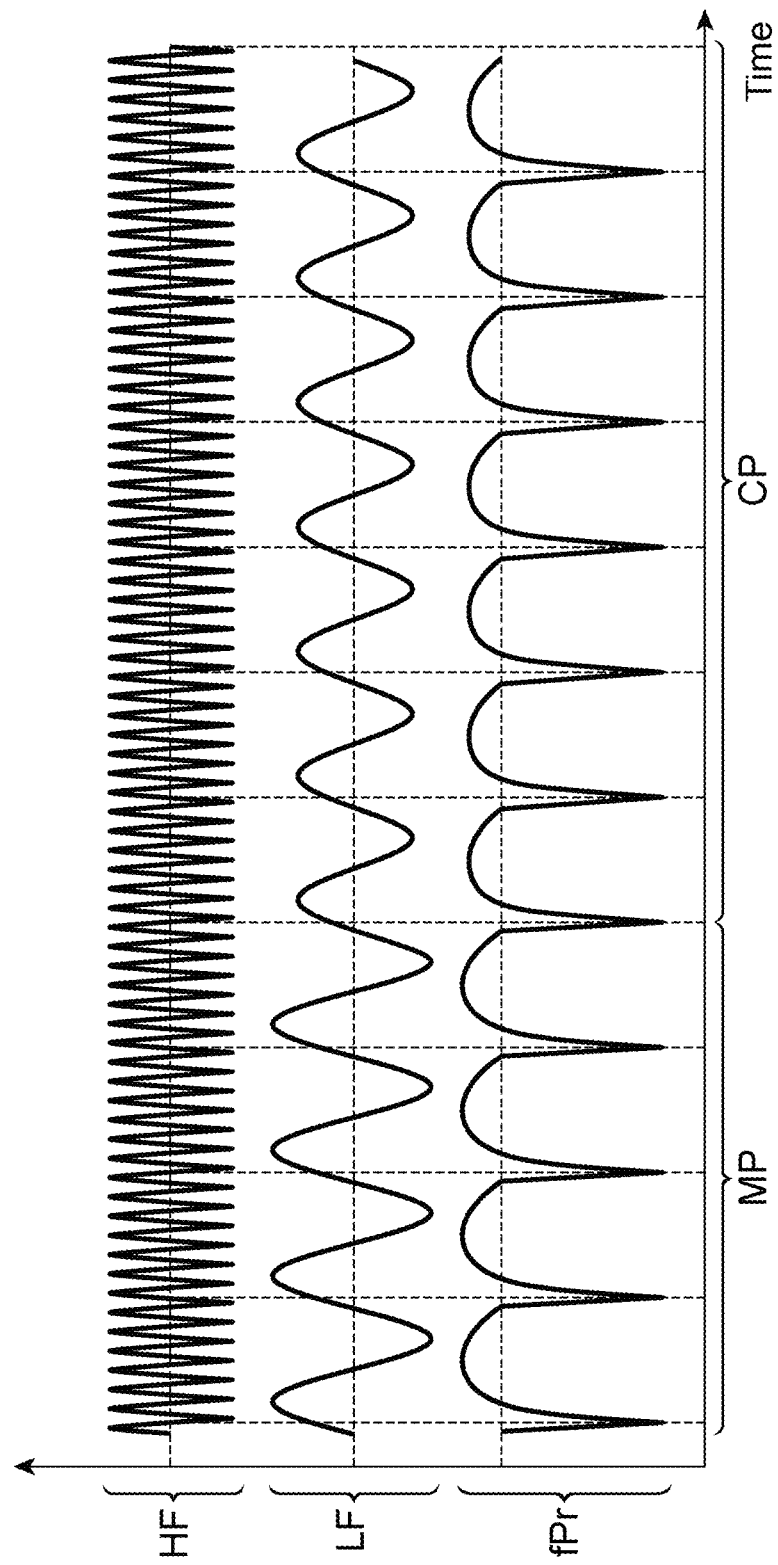
FIG. 2 is a timing chart associated with the plasma processing apparatus shown in FIG. 1 in an embodiment.
Figure 3:
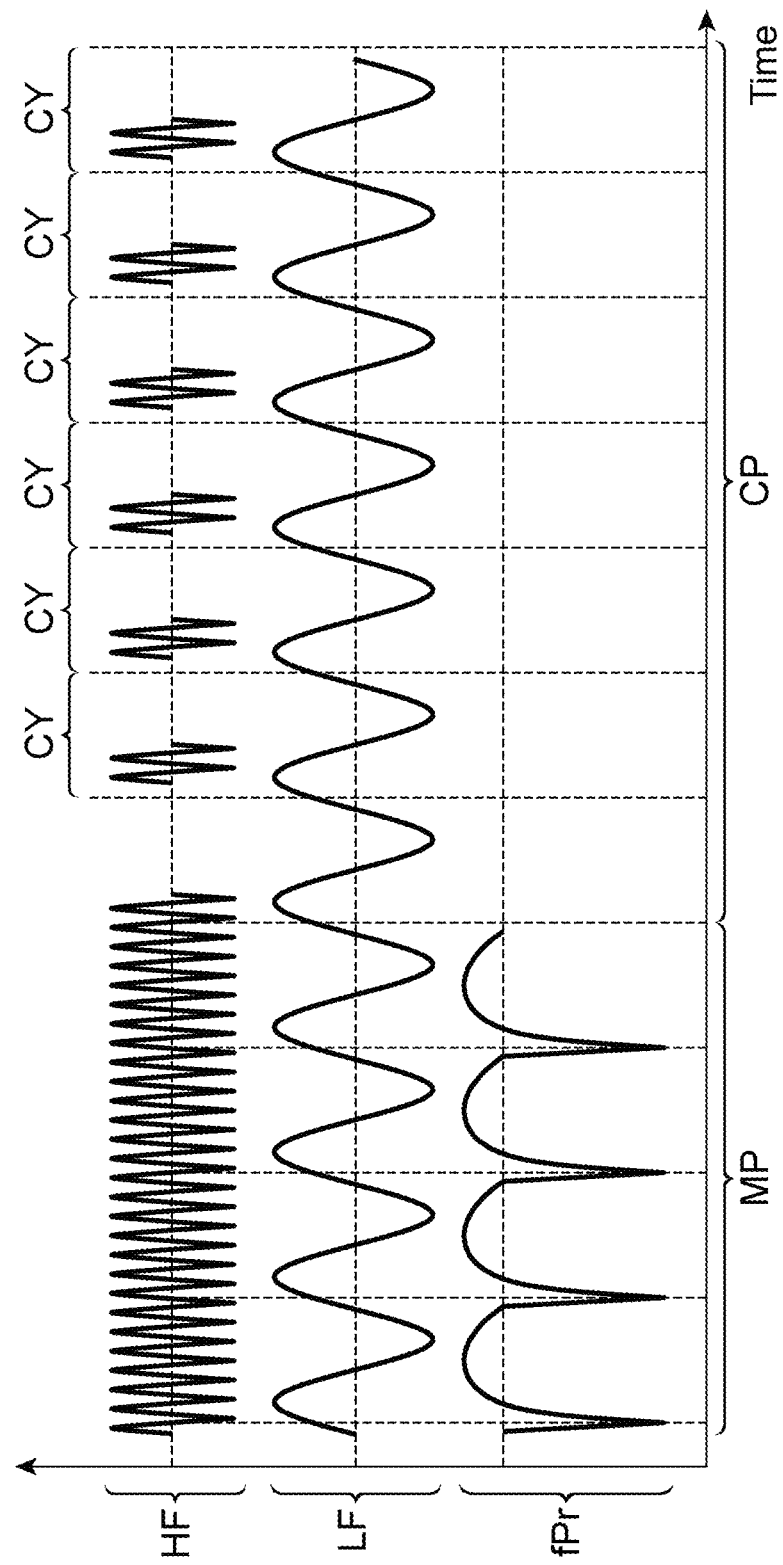
FIG. 3 is a timing chart associated with the plasma processing apparatus shown in FIG. 1 in another embodiment.
Figure 4:
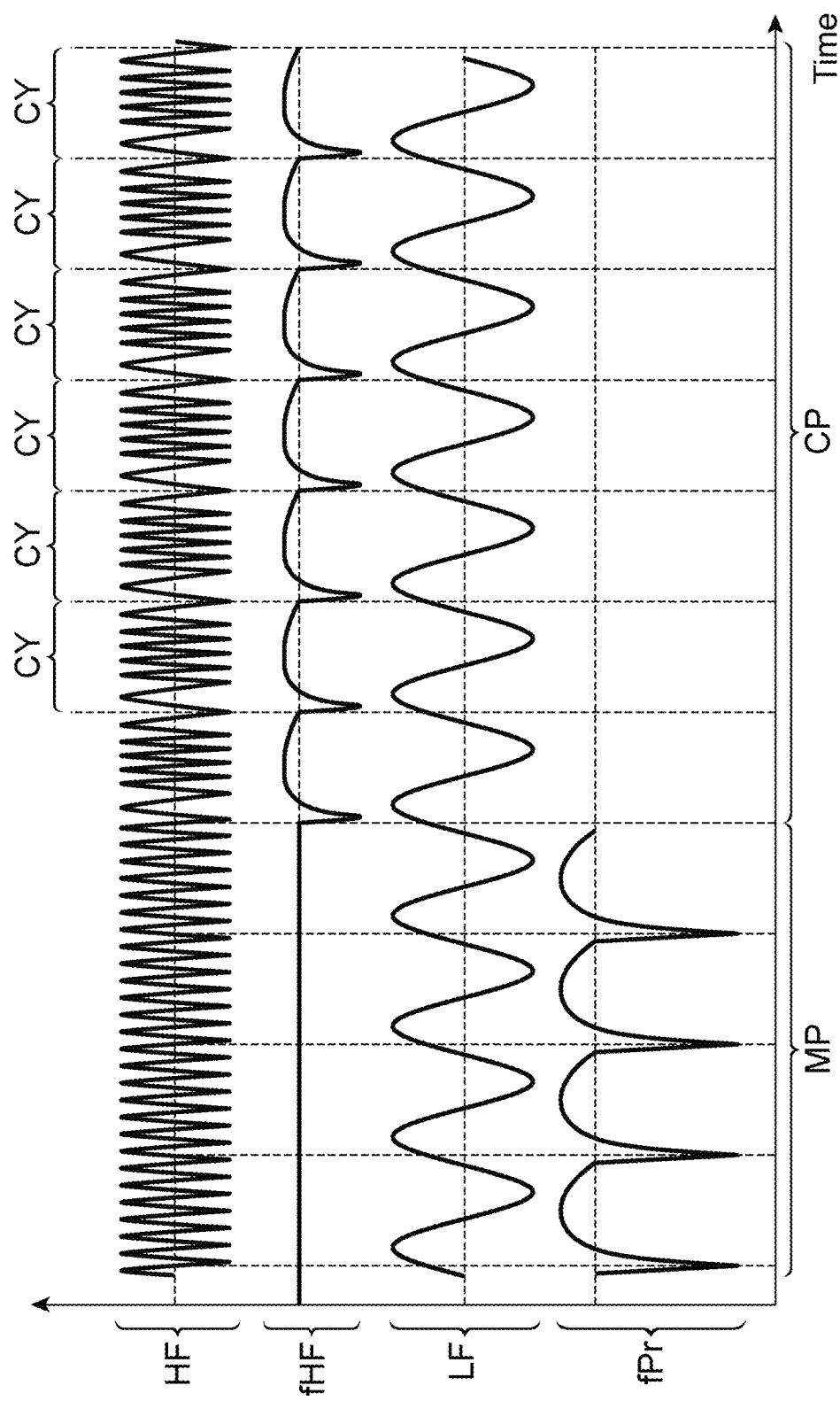
FIG. 4 is a timing chart associated with the plasma processing apparatus shown in FIG. 1 in still another embodiment.

The controller 80 controls the RF power supply 61 or the bias power supply 62 or both using the frequency fPr of the reflected wave Pr. The controller 80 may include an arithmetic unit, such as a processor. FIGS. 2 to 4 will now be referred to, in addition to FIG. 1. FIG. 2 is a timing chart associated with the plasma processing apparatus shown in FIG. 1 in an embodiment. FIG. 3 is a timing chart associated with the plasma processing apparatus shown in FIG. 1 in another embodiment. FIG. 4 is a timing chart associated with the plasma processing apparatus shown in FIG. 1 in still another embodiment. FIGS. 2 to 4 show the timing charts of the RF power HF, the RF bias power LF, and the frequency fPr of the reflected wave Pr. FIG. 4 further shows a timing chart of a set frequency fHF of the RF power HF.

The controller 80 monitors the frequency fPr during a monitoring period MP (refer to FIGS. 2 to 4). In one embodiment, the controller 80 monitors the peak of the absolute values of the negative shifts Δf among the shifts in the frequency fPr from the frequency of the RF power HF. The shift has a positive value when the frequency fPr is higher than the frequency of the RF power HF and has a negative value when the frequency fPr is lower than the frequency of the RF power HF. To obtain the negative shift Δf, the controller 80 may determine the shift in the frequency fPr from the frequency fPf (the frequency of the RF power HF) provided by the measuring device 64.

In one embodiment, the controller 80 determines a peak value ΔfP of the absolute values of the negative shifts Δf during the monitoring period MP. In other words, the controller 80 determines the peak value ΔfP of the negative difference values among the difference values between the frequency fPr and the frequency of the RF power HF (or the frequency fPf) during the monitoring period MP in this embodiment. The difference value is the value obtained by subtracting the frequency of the RF power HF (or the frequency fPf) from the frequency fPr. The difference value has a positive value when the frequency fPr is higher than the frequency of the RF power HF (or the frequency fPf) and has a negative value when the frequency fPr is lower than the frequency of the RF power HF (or the frequency fPf). The controller 80 may determine an average value of several peak values of the absolute values of the negative shifts Δf during the monitoring period MP as the peak value ΔfP.

As shown in FIG. 2, the controller 80 controls the bias power supply 62 to adjust the power level of the RF bias power LF during a control period CP after the monitoring period MP in accordance with the peak value ΔfP. The controller 80 may store a predetermined relationship between the peak value ΔfP and the power level of the RF bias power LF as a function or a table in its storage. The controller 80 may use the relationship to determine the power level of the RF bias power LF in accordance with the peak value ΔfP, and control the bias power supply 62 to provide RF bias power LF having the determined power level. In the example shown in FIG. 2, the power level of the RF bias power LF during the control period CP is adjusted to a lower level than the power level of the RF bias power LF during the monitoring period MP.

In another embodiment, the controller 80 controls the RF power supply 61 to modulate the RF power HF in a cycle CY obtained based on the occurrence time of the peak of the absolute values of the negative shifts Δf during the monitoring period MP. The controller 80 may determine the negative shifts Δf and determine the time at which the peak value ΔfP of the absolute values of the negative shifts Δf occurs as the peak occurrence time. In another embodiment, the controller 80 may determine the occurrence time of the peak of the negative shifting in the frequency fPr as the occurrence time of the peak in the absolute values of the negative shifts Δf. The cycle CY obtained based on the occurrence time of the peak of the absolute values of the negative shifts Δf indicates the cycle of the potential changes in the substrate W over time in accordance with the RF bias power LF. The cycle is thus defined by the frequency of the RF bias power LF. However, the cycle CY of the potential changes in the substrate W over time in accordance with the RF bias power LF is delayed from the cycle of the RF bias power LF.

In the embodiment shown in FIG. 3, the controller 80 controls the RF power supply 61 to generate RF power HF in pulses in the cycle CY in the control period CP. More specifically, the controller 80 controls the RF power supply 61 to periodically provide the RF power HF in pulses in the cycle CY in the control period CP. In the embodiment shown in FIG. 3, the controller 80 may specify, for the RF power supply 61, the time and the duration to provide the RF power HF in pulses in the cycle CY. The RF power supply 61 may start to generate the RF power HF in pulses at the time specified by the controller 80 and continue to generate the RF power HF in pulses for the duration specified by the controller 80 in the cycle CY.

In the embodiment shown in FIG. 4, the controller 80 controls the RF power supply 61 to modulate the frequency (set frequency fHF) of the RF power HF in the cycle CY in the control period CP. In one example, the controller 80 modulates the frequency of the RF power HF in the cycle CY to reduce the reflection of the RF power HF. The controller 80 may modulate the frequency of the RF power HF in the cycle CY using data prestored in its storage. The data indicates the modulation of the frequency of the RF power HF, or changes in the set frequency fHF over time.

The plasma processing apparatus 1 may further include a main controller MC. The main controller MC is a computer including a processor, a storage, an input device, and a display. The main controller MC controls the components of the plasma processing apparatus 1. More specifically, the main controller MC executes a control program stored in the storage to control the components of the plasma processing apparatus 1 in accordance with recipe data stored in the storage. As controlled by the main controller MC, the plasma processing apparatus 1 performs a process specified by the recipe data. The main controller MC may perform the control described above, instead of the controller 80.

Figure 5:
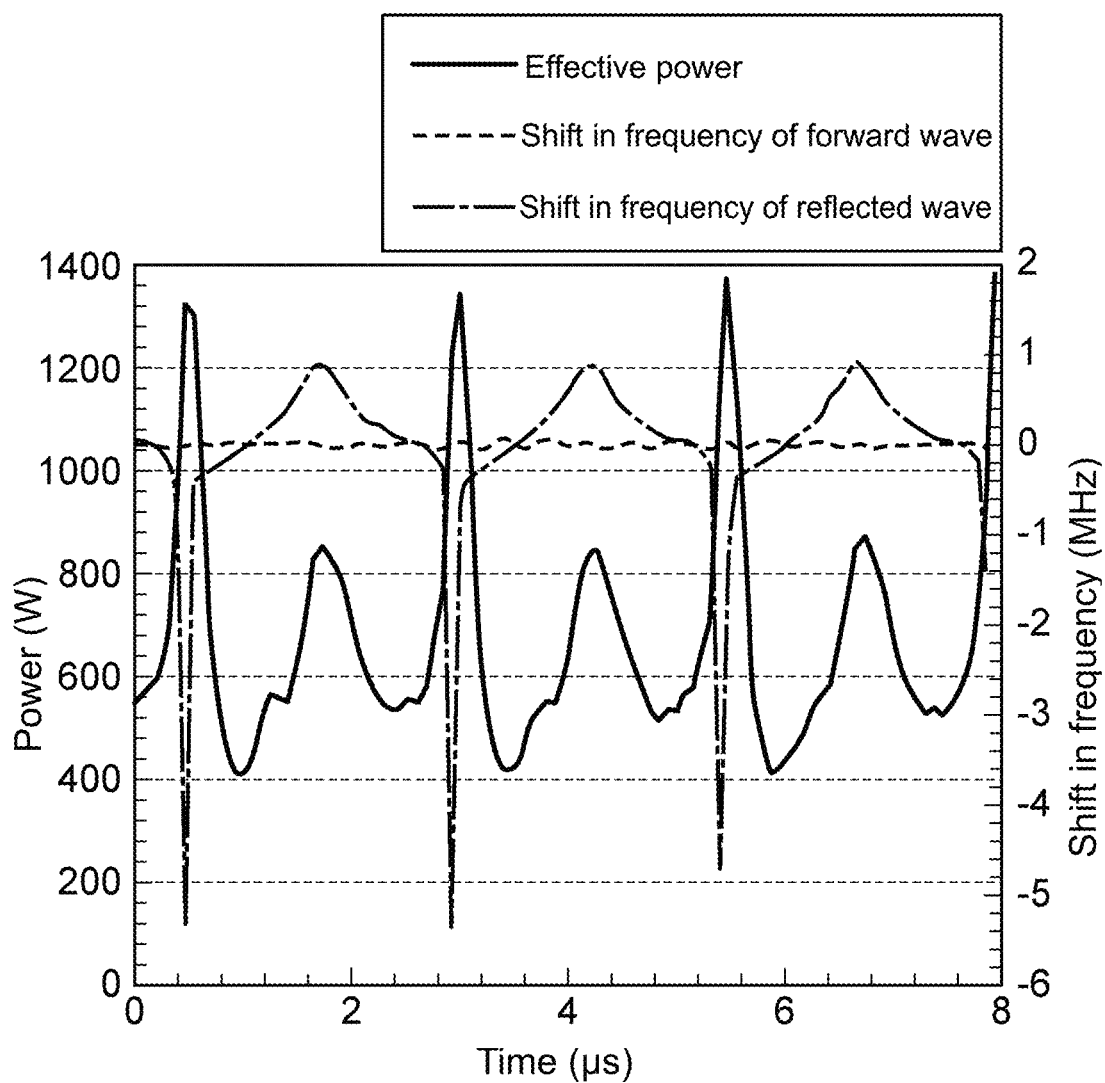
FIG. 5 is a graph showing changes over time in the effective power, shift in the frequency of a forward wave, and shift in the frequency of a reflected wave in the plasma processing apparatus shown in FIG. 1.

FIG. 5 is a graph showing changes over time in the effective power, shift in the frequency of the forward wave, and shift in the frequency of the reflected wave in the plasma processing apparatus shown in FIG. 1. The effective power is the difference between the power of the forward wave and the power of the reflected wave of the RF power HF, or the power coupled to the plasma. The shift in the frequency of the forward wave is the value obtained by subtracting the set frequency fHF of the RF power HF from the frequency fPf of the forward wave Pf. The shift in the frequency of the reflected wave is the value obtained by subtracting the frequency of the RF power HF (e.g., frequency fPf) from the frequency fPr of the reflected wave Pr.

As shown in FIG. 5, the frequency fPf of the forward wave Pf has substantially the same value as the set frequency fHF of the RF power HF. The frequency fPr of the reflected wave Pr changes greatly with respect to the frequency of the RF power HF, or the frequency fPf of the forward wave Pf. More specifically, in response to a potential switching in the substrate from negative to positive, the frequency fPr of the reflected wave Pr has a large negative shift from the frequency of the RF power HF. In other words, the absolute values of the negative shifts in the frequency fPr of the reflected wave Pr from the frequency of the RF power HF (or the frequency fPf of the forward wave Pf) have a peak in response to the potential switching in the substrate W from negative to positive.

The potential of the substrate changes periodically in a cycle defined by the frequency of the RF bias power LF. In other words, the potential of the substrate periodically switches from negative to positive in a cycle defined by the frequency of the RF bias power LF. The cycle CY of changes in the potential of the substrate W over time may be obtained by determining the occurrence time of the peak of the absolute values of the negative shifts $\Delta f$ in the frequency fPr of the reflected wave Pr from the frequency (or the frequency fPf) of the RF power HF. In the embodiments shown in FIGS. 3 and 4, the RF power HF may be modulated in accordance with changes in the substrate potential over time through modulation of the RF power HF in the cycle CY obtained in this manner.

The effective power may also have a peak in response to the potential switching in the substrate W from negative to positive. However, depending on the type of gas supplied into the chamber 10, the peak of the effective power in response to the potential switching in the substrate W from negative to positive may be less distinguishable from other peaks of the effective power. The occurrence time of the peak of the absolute values of the negative shifts $\Delta f$ may thus be effectively used to obtain the cycle of changes in the potential of the substrate W over time.

Figure 6:
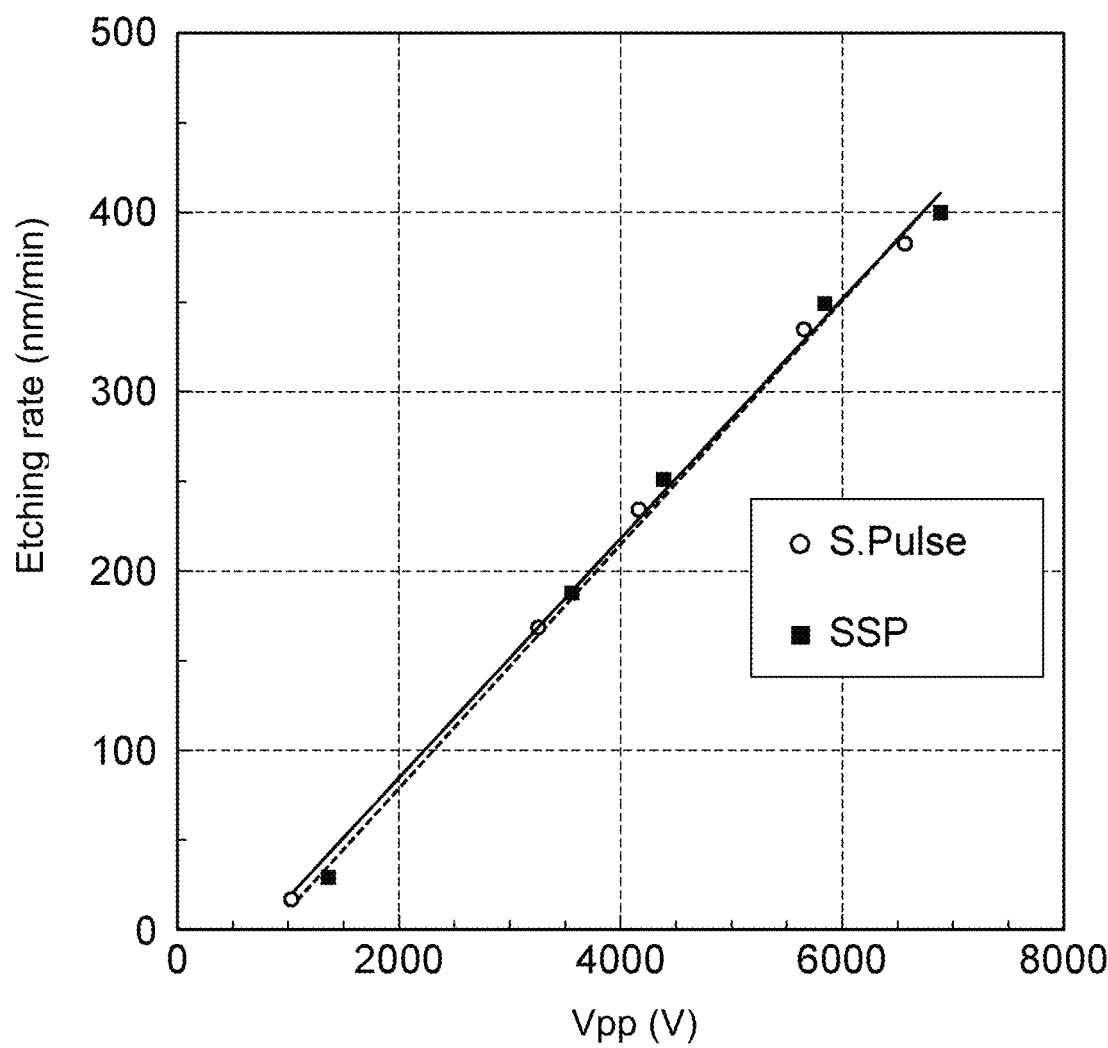
FIG. 6 is a graph showing the relationship between the amplitude Vpp of a voltage applied to a substrate and the etching rate of a silicon oxide film in the plasma processing apparatus shown in FIG. 1.
Figure 7:
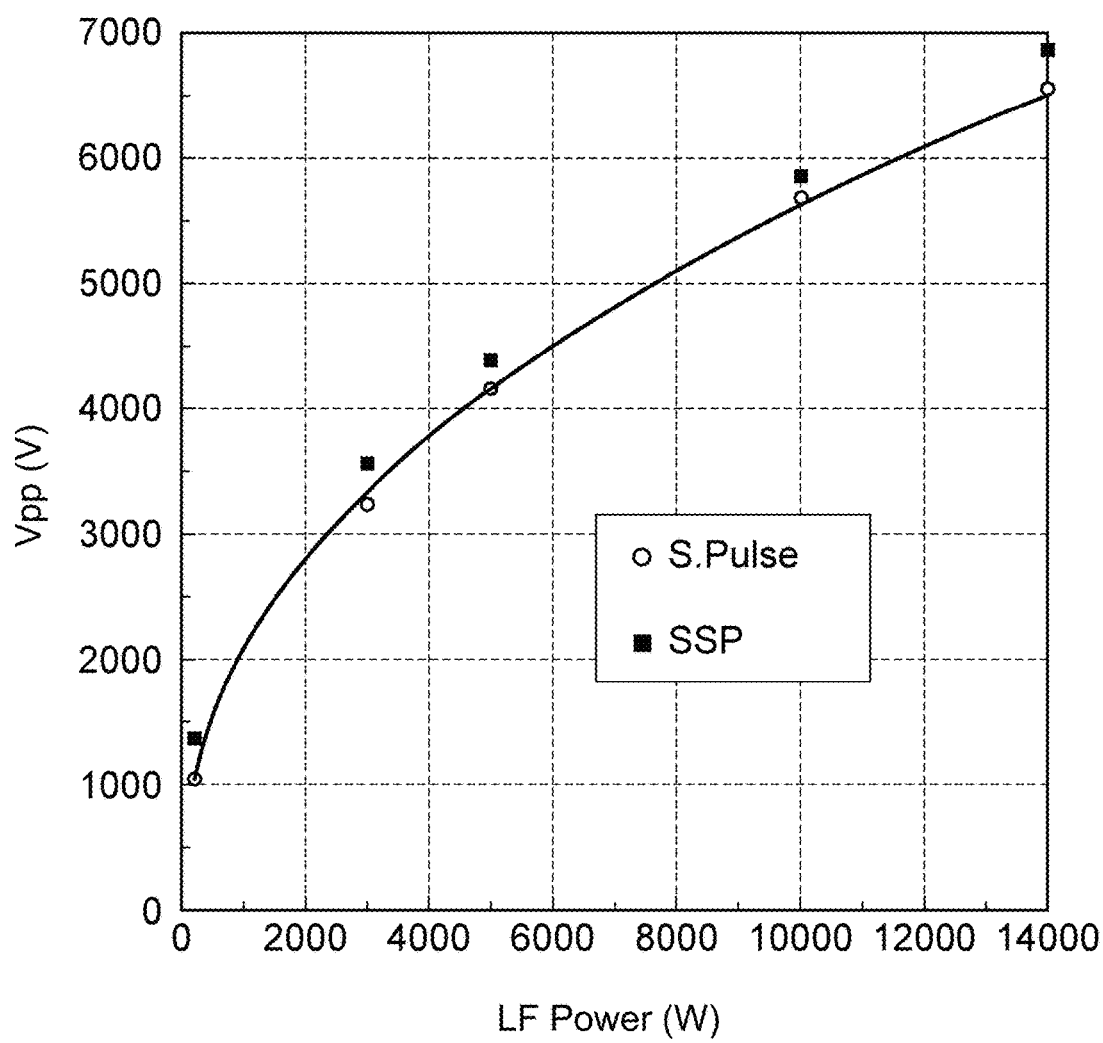
FIG. 7 is a graph showing the relationship between radio-frequency (RF) bias power LF and the amplitude Vpp for the etching rate shown in FIG. 6.
Figure 8:
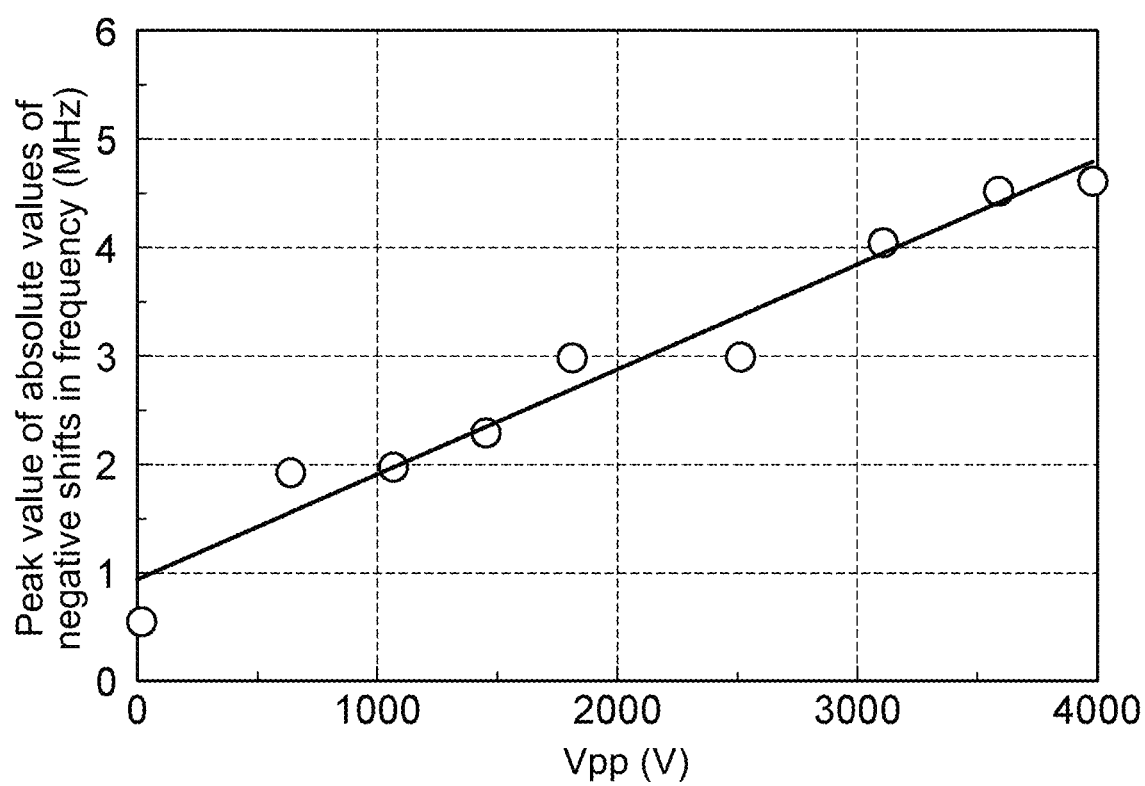
FIG. 8 is a graph showing the relationship between the amplitude Vpp and the peak value of the absolute values of the negative shifts in the frequency of the reflected wave for the etching rate shown in FIG. 6.

Silicon oxide films on multiple sample substrates were etched under conditions different from each other using the plasma processing apparatus 1. The results are shown in FIGS. 6 to 8. For each of the sample substrates, the amplitude Vpp of the voltage across the sample substrate during the etching of the silicon oxide film, the etching rate of the silicon oxide film, and the peak value of the absolute values of the negative shifts $\Delta f$ in the frequency fPr of the reflected wave Pr were obtained. FIG. 6 is a graph showing the relationship between the amplitude Vpp and the etching rate of the silicon oxide film obtained using the plasma processing apparatus shown in FIG. 1. FIG. 7 is a graph showing the relationship between the RF bias power LF (power level) and the amplitude Vpp for the etching rate shown in FIG. 6. FIG. 8 is a graph showing the relationship between the amplitude Vpp and the peak value of the absolute values of the negative shifts in the frequency of the reflected wave for the etching rate shown in FIG. 6. In FIGS. 6 and 7, S.Pulse indicates the RF power HF and the RF bias power LF periodically provided in pulses in synchronization with each other. In FIGS. 6 and 7, SSP indicates the RF bias power LF provided as a continuous wave and the RF power HF periodically provided in pulses in a cycle defined by the frequency of the RF bias power LF.

As shown in FIG. 7, the amplitude Vpp with S.Pulse was different from the amplitude Vpp with SSP under the same power level of the RF bias power LF. As shown in FIG. 6, the etching rate has a linear correlation with the amplitude Vpp. As shown in FIG. 8, the amplitude Vpp has a linear correlation with the peak value of the absolute values of the negative shifts $\Delta f$ in the frequency fPr of the reflected wave Pr. To effectively control the etching rate, the amplitude Vpp, which is correlated with the energy of ions striking the substrate, is measured and the power level of the RF bias power LF is adjusted in accordance with the measured amplitude Vpp. However, direct measurement of the amplitude Vpp is difficult with the substrate having a high potential. As described above with reference to FIG. 7, the amplitude Vpp may differ under the same power level of the RF bias power LF. The peak value $\Delta$fP of the absolute values of the negative shifts $\Delta f$ in the frequency fPr of the reflected wave Pr has a linear correlation with the amplitude Vpp. Thus, the etching rate can be controlled by adjusting the power level of the RF bias power LF in accordance with the peak value $\Delta$fP.

In the embodiment shown in FIG. 2, the power level of the RF bias power LF is adjusted in accordance with the peak value $\Delta$fP of the absolute values of the negative shifts $\Delta f$ in the frequency fPr of the reflected wave Pr from the frequency of the RF power HF as described above. The energy of ions striking the substrate thus can be controlled in accordance with the amplitude Vpp of the substrate potential.

Figure 9:
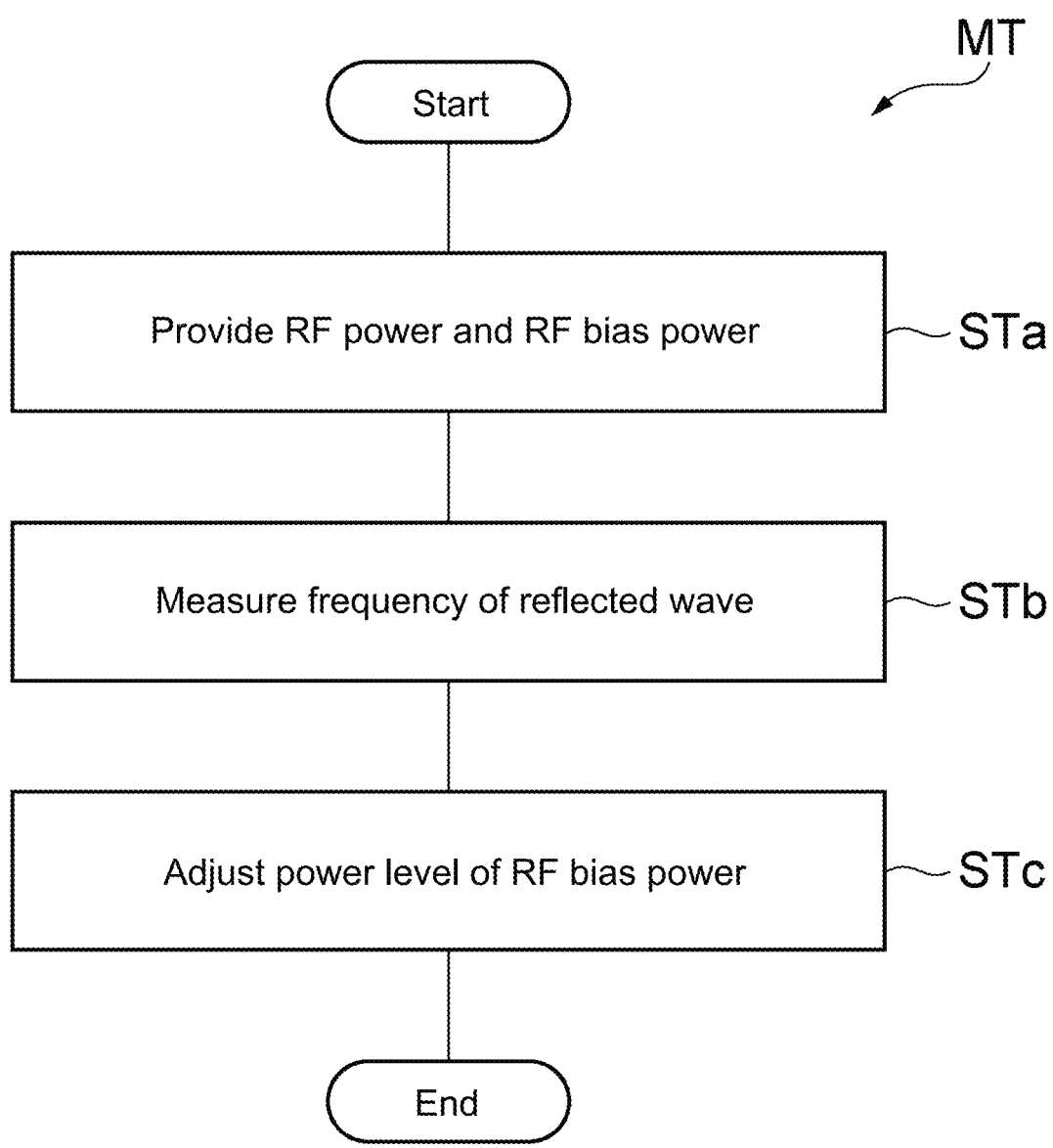
FIG. 9 is a flowchart of a plasma processing method according to an exemplary embodiment.
Figure 10:
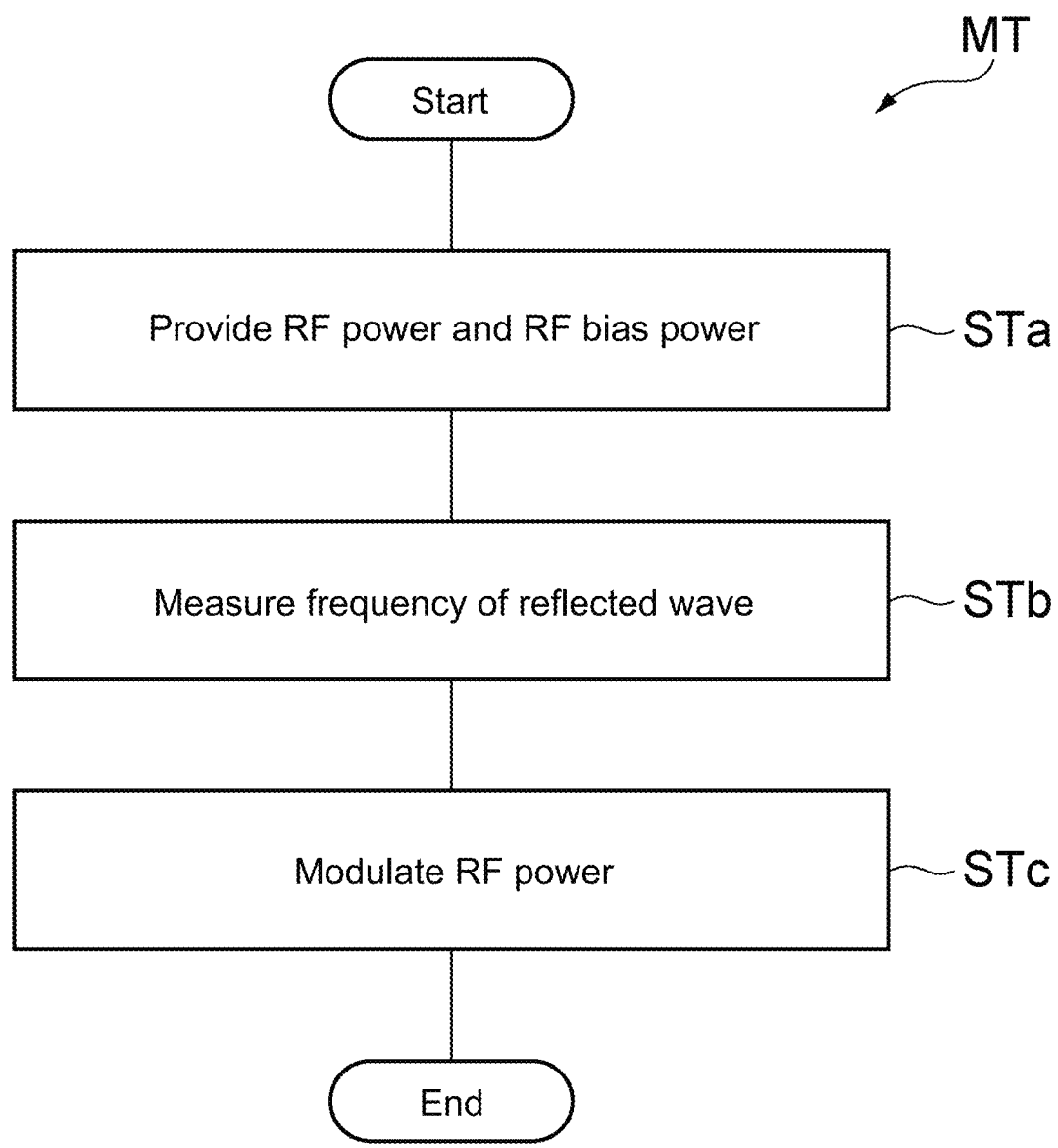
FIG. 10 is a flowchart of a plasma processing method according to another exemplary embodiment.

Referring now to FIGS. 9 and 10, a plasma processing method (hereinafter referred to as the method MT) according to various exemplary embodiments will be described. FIG. 9 is a flowchart of a plasma processing method according to an exemplary embodiment. FIG. 10 is a flowchart of a plasma processing method according to another exemplary embodiment.

The method MT is implemented with the substrate W placed on the substrate support 16 in the plasma processing apparatus 1. A process gas is supplied into the chamber 10 in the plasma processing apparatus 1 while the method MT is performed. The exhaust device 50 operates to maintain the chamber 10 at a specified gas pressure.

The method MT according to each of the embodiments shown in FIGS. 9 and 10 includes step STa. In step STa, RF power HF (RF power) and RF bias power LF (RF bias power) are provided to the lower electrode 18. In step STa, plasma is generated from the process gas in the chamber 10.

In the subsequent step STb, the frequency fPr of the reflected wave Pr is measured. The frequency fPr may be measured with the measuring device 64. The frequency fPr may be measured during the monitoring period MP as described above.

In the embodiment shown in FIG. 9, the power level of the RF bias power LF (RF bias power) is adjusted in accordance with the peak value $\Delta$fP of the absolute values of the negative shifts $\Delta f$ in the frequency fPr of the reflected wave Pr from the frequency of the RF power HF in the subsequent step STc. The adjustment of the power level of the RF bias power LF is described above referring to FIG. 2.

In the embodiment shown in FIG. 10, the RF power HF is modulated in the cycle CY, which is obtained based on the occurrence time of the peak of the absolute values of the negative shifts Δf in the frequency fPr of the reflected wave Pr from the frequency of the RF power HF in the subsequent step STc. The modulation of the RF power HF in the cycle CY is described above referring to the embodiments in FIGS. 3 and 4.

Although the exemplary embodiments have been described above, the embodiments are not restrictive, and various additions, omissions, substitutions, and changes may be made. The components in the different exemplary embodiments may be combined to form another exemplary embodiment.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
16 Substrate support
61 Radio-frequency (RF) power supply
62 Bias power supply
64 Measuring device
80 Controller

What is claimed is:

1. A plasma processing apparatus, comprising:
   a chamber;
   a substrate support including a lower electrode, the substrate support being accommodated in the chamber;
   a radio-frequency power supply configured to provide radio-frequency power to generate plasma to the lower electrode or an upper electrode above the lower electrode;
   a bias power supply configured to provide radio-frequency bias power to the lower electrode;
   a frequency detector that measures frequency of a reflected wave of the radio-frequency power, the reflected wave being returned toward the radio-frequency power supply; and
   a controller configured to control the bias power supply to adjust a power level of the radio-frequency bias power in accordance with a peak value of absolute values of negative shifts in frequency of the reflected wave from a frequency of the radio-frequency power, or to control the radio-frequency power supply to modulate the radio-frequency power in a cycle obtained based on an occurrence time of a peak of absolute values of negative shifts in frequency of the reflected wave from the frequency of the radio-frequency power.

2. The plasma processing apparatus according to claim 1, wherein
   the controller determines the occurrence time of the peak based on an occurrence time of the peak value or on an occurrence time of a peak of negative shifting in frequency of the reflected wave from the frequency of the radio-frequency power, and obtains the cycle.

3. The plasma processing apparatus according to claim 1, wherein
   the controller controls the radio-frequency power supply to generate the radio-frequency power in pulses in the cycle.

4. The plasma processing apparatus according to claim 2, wherein
   the controller controls the radio-frequency power supply to generate the radio-frequency power in pulses in the cycle.

5. The plasma processing apparatus according to claim 3, wherein
   the controller specifies, for the radio-frequency power supply, a time and a duration to provide the radio-frequency power in pulses in the cycle, and
   the radio-frequency power supply starts to generate the radio-frequency power in pulses at the time specified by the controller and continues to generate the radio-frequency power in pulses for the duration specified by the controller in the cycle.

6. The plasma processing apparatus according to claim 4, wherein
   the controller specifies, for the radio-frequency power supply, a time and a duration to provide the radio-frequency power in pulses in the cycle, and
   the radio-frequency power supply starts to generate the radio-frequency power in pulses at the time specified by the controller and continues to generate the radio-frequency power in pulses for the duration specified by the controller in the cycle.

7. The plasma processing apparatus according to claim 1, wherein
   the controller controls the radio-frequency power supply to frequency modulate the radio-frequency power in the cycle.

8. The plasma processing apparatus according to claim 2, wherein
   the controller controls the radio-frequency power supply to frequency modulate the radio-frequency power in the cycle.

9. The plasma processing apparatus according to claim 1, wherein
   the peak value is a peak value of a difference between the frequency of the radio-frequency power and the frequency of the reflected wave.

10. A plasma processing method, comprising:
    providing radio-frequency power to generate plasma and providing radio-frequency bias power, the radio-frequency power being provided from a radio-frequency power supply to a lower electrode included in a substrate support or to an upper electrode above the lower electrode, the substrate support being accommodated in a chamber in a plasma processing apparatus, the radio-frequency bias power being provided to the lower electrode from a bias power supply;
    measuring frequency of a reflected wave of the radio-frequency power, the reflected wave being returned toward the radio-frequency power supply; and
    adjusting a power level of the radio-frequency bias power in accordance with a peak value of absolute values of negative shifts in the frequency of the reflected wave from a frequency of the radio-frequency power.

11. The plasma processing method according to claim 10, further comprising
    determining with a controller the occurrence time of the peak based on an occurrence time of the peak value or on an occurrence time of a peak of negative shifting in frequency of the reflected wave from the frequency of the radio-frequency power, and obtains the cycle.

12. The plasma processing method according to claim 10, further comprising:
controlling with a controller the radio-frequency power supply to generate the radio-frequency power in pulses in the cycle.

13. The plasma processing method according to claim 12, further comprising:
specifying with the controller for the radio-frequency power supply, a time and a duration to provide the radio-frequency power in pulses in the cycle, and
starting the radio-frequency power supply to generate the radio-frequency power in pulses at the time specified by the controller and continuing to generate the radio-frequency power in pulses for the duration specified by the controller in the cycle.

14. The plasma processing method according to claim 10, further comprising:
controlling with a controller the radio-frequency power supply to frequency modulate the radio-frequency power in the cycle.

15. The plasma processing method according to claim 10, wherein
the peak value is a peak value of a difference between the frequency of the radio-frequency power and the frequency of the reflected wave.

16. A plasma processing method, comprising:
providing radio-frequency power to generate plasma and providing radio-frequency bias power, the radio-frequency power being provided from a radio-frequency power supply to a lower electrode included in a substrate support or to an upper electrode above the lower electrode, the substrate support being accommodated in a chamber in a plasma processing apparatus, the radio-frequency bias power being provided to the lower electrode from a bias power supply;
measuring frequency of a reflected wave of the radio-frequency power, the reflected wave being returned toward the radio-frequency power supply; and
modulating the radio-frequency power in a cycle obtained based on an occurrence time of a peak of absolute values of negative shifts in the frequency of the reflected wave from a frequency of the radio-frequency power.

17. The plasma processing method according to claim 16, further comprising
determining with a controller the occurrence time of the peak based on an occurrence time of the peak value or on an occurrence time of a peak of negative shifting in frequency of the reflected wave from the frequency of the radio-frequency power, and obtains the cycle.

18. The plasma processing method according to claim 16, further comprising:
controlling with a controller the radio-frequency power supply to generate the radio-frequency power in pulses in the cycle.

19. The plasma processing method according to claim 18, further comprising:
specifying with the controller for the radio-frequency power supply, a time and a duration to provide the radio-frequency power in pulses in the cycle, and
starting the radio-frequency power supply to generate the radio-frequency power in pulses at the time specified by the controller and continuing to generate the radio-frequency power in pulses for the duration specified by the controller in the cycle.

20. The plasma processing method according to claim 16, further comprising:
controlling with a controller the radio-frequency power supply to frequency modulate the radio-frequency power in the cycle.

* * * * *